United States Patent [19]
Kaltenecker

[11] Patent Number: 5,451,906
[45] Date of Patent: Sep. 19, 1995

[54] CIRCUIT FOR COMPENSATING AN AMPLIFIER

[75] Inventor: Robert S. Kaltenecker, Mesa, Ariz.

[73] Assignee: Motorola, Inc., Schaumburg, Ill.

[21] Appl. No.: 237,571

[22] Filed: May 3, 1994

[51] Int. Cl.⁶ .......................... H03F 1/14; H03F 1/34
[52] U.S. Cl. .................................. 330/292; 330/311; 330/294
[58] Field of Search ............... 330/265, 292, 294, 302, 330/311

[56] References Cited

U.S. PATENT DOCUMENTS 4,473,780  9/1984  Gent .............................. 330/311 X
4,758,799  7/1988  Ho et al. ........................ 330/311

Primary Examiner—Steven Mottola
Attorney, Agent, or Firm—Rennie William Dover

[57] ABSTRACT

A circuit for compensating a cascode amplifier has been provided. The circuit includes a capacitor and an inductor for enhancing the stability of the amplifier and for extending the usable frequency range of the amplifier by maintaining the group delay of the amplifier substantially constant over a large frequency range. With such a compensated amplifier, an improved CTB distortion performance in the upper operating frequency range of the amplifier is achieved with increased stability. In other words, the bandwidth of the amplifier is extended with improved stability and distortion performance.

15 Claims, 3 Drawing Sheets

CIRCUIT FOR COMPENSATING AN AMPLIFIER

FIELD OF THE INVENTION

This invention relates to amplifiers, and in particular, to a circuit for compensating CATV amplifiers thereby extending the usable frequency range of such amplifiers.

BACKGROUND OF THE INVENTION

Amplifiers are utilized in a myriad of applications, for example, in cable television (CATV applications). One important specification for a CATV amplifier is the composite triple beat (CTB) distortion performance. CTB distortion is a third order distortion term which is obtained having all channels in a cable TV system active, and then turning one channel off and finally observing distortion products occurring in that frequency range of the inactive channel. Ideally, there should be no signal occurring in that frequency range wherein the presence of any signals is due to distortion and is referred to as CTB distortion.

Typically, CATV amplifiers employ a cascode configuration because such a configuration inherently results in the best CTB performance. However, the cascode configuration experiences stability problems. Additionally, at high frequencies, the CTB performance of the cascode configuration degrades.

Hence, there exists a need for a circuit for compensating a cascode amplifier having improved CTB distortion performance with excellent stability and high frequency performance.

DETAILED DESCRIPTION OF THE DRAWINGS

Figure 1:
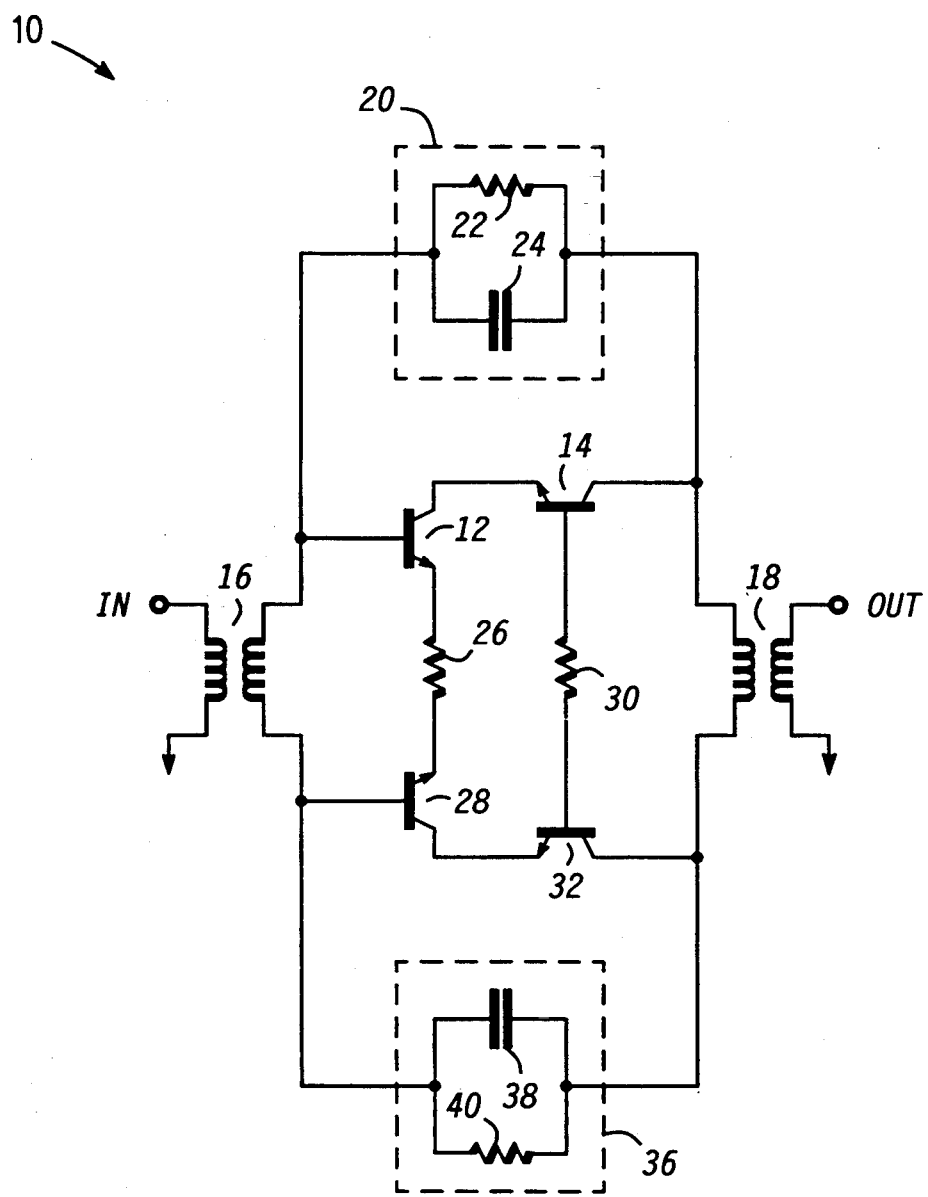
FIG. 1 is a detailed schematic diagram of a prior art push-pull cascode amplifier.

Referring to FIG. 1, there is illustrated a detailed schematic of prior art push-pull cascode amplifier 10. It is understood that the schematic of FIG. 1 is an ac schematic, the dc bias details are not included. The dc biasing components that have been omitted are the bias resistors used to set the currents and voltages for the transistors. These components have a negligible effect on the ac performance of a well-designed circuit since they are commonly connected at an ac ground point. Being at ac ground they are not necessary for a discussion of the ac performance of the amplifier.

Amplifier 10 includes transistor 12 having a collector coupled to an emitter of transistor 14 and a base coupled through transformer 16 to input IN. The collector of transistor 14 is coupled through transformer 18 for providing an output signal at output OUT.

Feedback circuit 20 is coupled between the collector of transistor 14 and the base of transistor 12 wherein feedback circuit 20 includes parallel coupled components: resistor 22 and capacitor 24.

The emitter of transistor 12 is coupled through resistor 26 to the emitter of transistor 28. Moreover, the base of transistor 14 is coupled through resistor 30 to the base of transistor 32.

The base of transistor 28 is coupled via transformer 16 to input IN. Also, the collector of transistor 32 is coupled through transformer 18 to output OUT. The collector of transistor 28 is coupled to the emitter of transistor 32.

Feedback circuit 36 is coupled between the collector of transistor 32 and the base of transistor 28 wherein feedback circuit 36 includes parallel coupled components capacitor 38 and resistor 40.

The amplifier 10 is a balanced push-pull amplifier, that is, the input signal at the base of transistor 12 is 180 degrees out of phase with the input signal at the base of transistor 28. In operation, assume a reference signal (sine wave at zero phase, increasing positively in amplitude) is applied at the input terminal of transformer 16 wherein transformer 16 converts this reference signal to a balanced signal at the bases of the transistors 12 and 28. In particular, the signal at the base of transistor 12 has the same phase as the reference input signal (increasing positively in amplitude) while the signal at the base of the transistor 28 is 180 degrees out of phase (sine wave with a 180 degree phase shift, increasing negatively in amplitude). The balanced signals obtain another 180 degree phase shift as they progress through transistors 12 and 28. The signal at the collector of transistor 12 is now increasing negatively in amplitude while the signal at the collector of transistor 28 is now increasing positively in amplitude. The signals are still 180 degrees out of phase with respect to each other. As the balanced signals progress through the transistors 14 and 32 they do not undergo any phase shift appear balanced at the terminals of transformer 18. Transformer 18 converts these balanced signals into a single ended signal at the output terminal. This type of signal progression through the amplifier is commonly referred to as push-pull operation. While transistor 12 is pushing the signal (positively increasing amplitude), transistor 28 is pulling the signal (negatively increasing amplitude), hence the term push-pull. The same is true for transistors 14 and 32. From this simplified explanation of the circuit operation, it is observed that the signals are identical in magnitude in transistors 12 and 28 and in transistors 14 and 32, the only difference being a 180 degree phase shift.

Due to the broad operating frequency range requirements of a CATV amplifier (typically 40 Mhz to 1000 Mhz), feedback is used to simultaneously meet the gain and match requirements over this wide frequency range. Resistors 22, 26 and 40 are essentially chosen to meet the gain and match requirements in the lower frequency portion of the operating band while the capacitors 24 and 38 are used to shape the gain and match requirements in the upper frequency portion. Typically resistors 22 and 40 are identical in value as are the capacitors 24 and 38. In a practical CATV amplifier, the base resistor 30 is often necessary for stable operation of the amplifier. The CATV amplifier is one component in a complete CATV system, whereas additional frequency shaping circuits are used and these circuits can present a wide range of impedances to the CATV amplifier over its operating range. This wide variation in impedance can produce stability problems (oscillation) in the system. The presence of a small resistance 30 can greatly reduce this tendency toward oscillation, however, with the addition of resistor 30 a degradation in the amplifier CTB distortion performance and overall bandwidth is observed.

FIG. 1 depicts the full balanced configuration of the amplifier, due to the nature of the operation of balanced circuits explained previously, it is convenient to consider only one side of the balanced circuit. The upper side of the balanced amplifier consists of transistors 12 and 14, feedback network 20 and one half of resistor 26 and resistor 30. The lower side of the balanced amplifier consists of transistors 28 and 32, feedback network 36 and the remaining halves of resistors 26 and 30. Each side has identical signals in magnitude but with a 180 degree phase difference.

Figure 2:
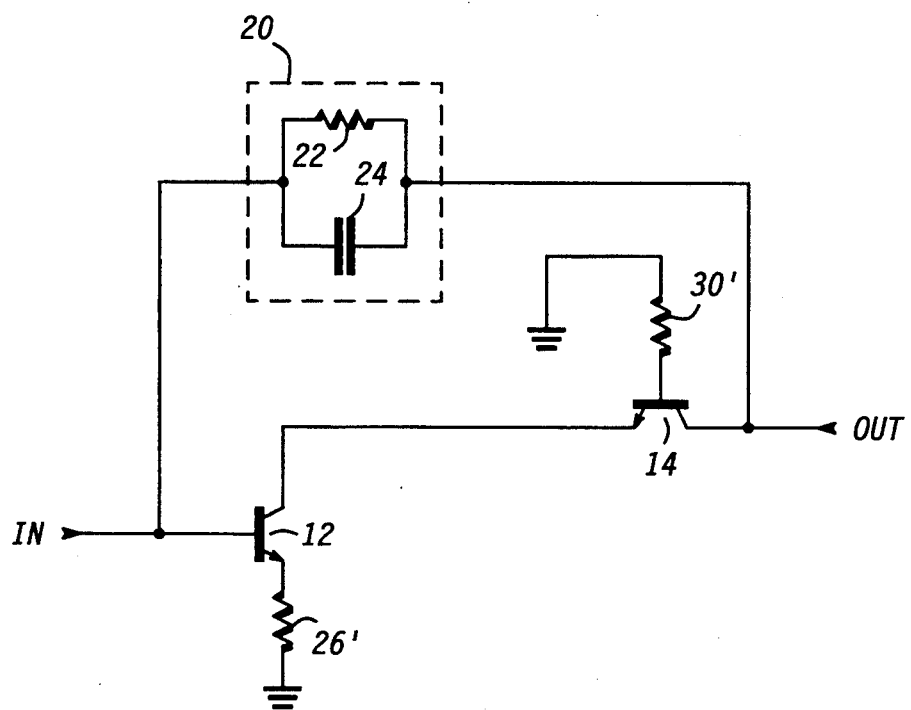
FIG. 2 is a detailed schematic diagram of one side of the prior art push-pull cascode amplifier of FIG. 1.

Referring to FIG. 2, one side of the push-pull cascode amplifier 10 is shown for simplicity of discussion. It is understood that components shown in FIG. 2 that are identical to components shown in FIG. 1 are identified by the same reference numbers.

The one side cascode amplifier of FIG. 2 further includes resistor 26' which is coupled between the emitter of transistor 12 and a ground reference. Moreover, resistor 30' is shown coupled between the base of transistor 14 and ground reference. It is understood that reference numbers 26' and 30' correspond to resistors 26 and 30, respectively of FIG. 1 but when considering a single side implementation the value of each resistor is reduced by a factor of two and one side is returned to ground reference. The impedance levels on the input and output are also reduced by a factor of two. Circuit operation (voltage and current levels) are now identical in the single sided implementation and the balanced configuration of FIG.1.

Figure 3:
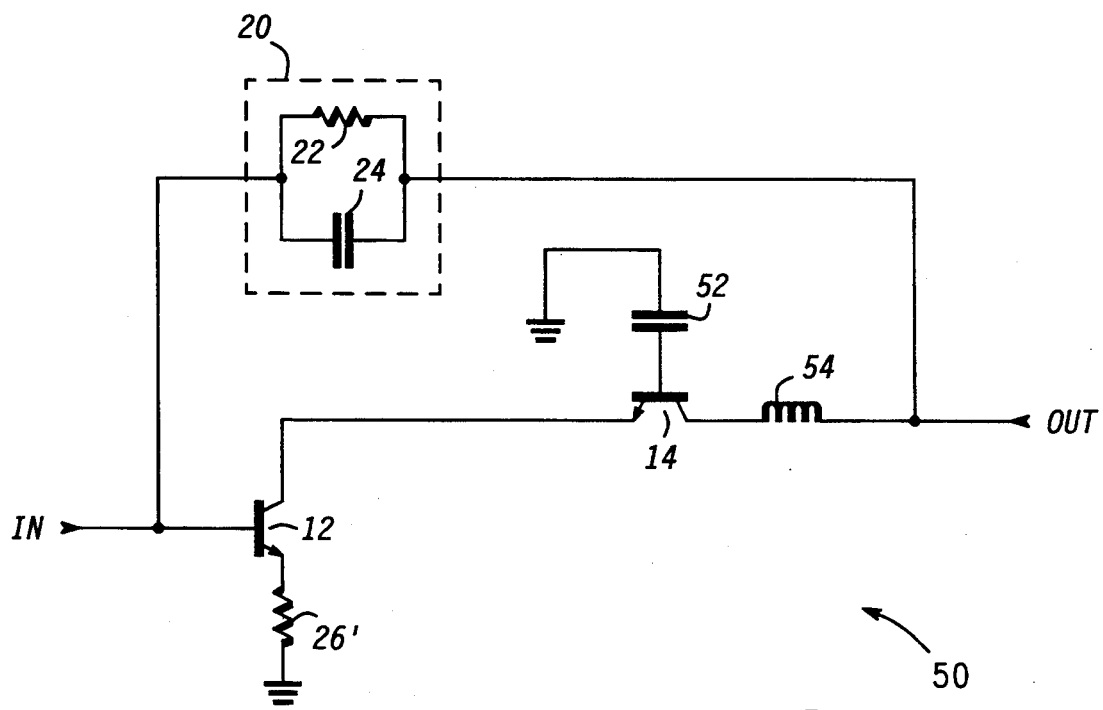
FIG. 3 is a detailed schematic diagram of one side of a push-pull cascode amplifier in accordance with the present invention.

Referring to FIG. 3, there is illustrated a detailed schematic diagram of cascode amplifier circuit 50 having compensation. It is understood that components shown in FIG. 3 that are identical to components shown in FIG. 2 are identified by the same reference numbers. Cascode amplifier circuit 50 additionally includes compensating capacitor 52 coupled between the base of transistor 14 and ground reference. Additionally, amplifier 50 includes compensating inductor 54 coupled between the collector of transistor 14 and an output of amplifier 50.

The additional components 52 and 54 result in improved CTB distortion performance by extending the frequency range over which a linear phase shift (or constant group delay) is achieved along with a substantial improvement in amplifier stability.

A suitable design procedure is to select the value of the base capacitor 52 to increase the broadband stability performance of the amplifier, and then select the compensating inductor 54 to maximize the linear phase response of amplifier 50, that is, inductor 54 is selected to extend the frequency range over which a linear phase (constant group delay) is achieved. These initial values for components 52 and 54 can then be used as the starting values for computer optimization of performance for amplifier 50 by using an optimization program such as Hewlett Packard's Microwave Design system.

Typically, the measured CTB distortion of amplifier 50 have improvements of approximately 3.0 to 5.0 dB in the upper frequency range of operation with respect to prior art configurations, indicating improved CTB distortion performance. Moreover, one indication of the relative stability performance of an amplifier can be determined by examination of the input and output return losses of an amplifier. One condition necessary for stability is that the input and output return losses of the amplifier are less than unity. Measured input and output return losses are typically 2.0 to 4.0 dB lower than those achieved with the prior art configuration, indicating improved amplifier stability performance.

The increase in amplifier stability does not degrade distortion performance, this is significant because the prior art implementation for improved stability using the base resistor 30' of FIG. 2 does degrade distortion performance. Additionally the stability improvement is broadband, capacitor 52 is not resonating with the base inductance of transistor 14, this would result in a narrow band stability improvement. In fact capacitor 52 is relatively small in value, to the point where operation at the low end of the frequency range would seem to be compromised; however, measured performance has shown that this is certainly not the case.

Figure 4:
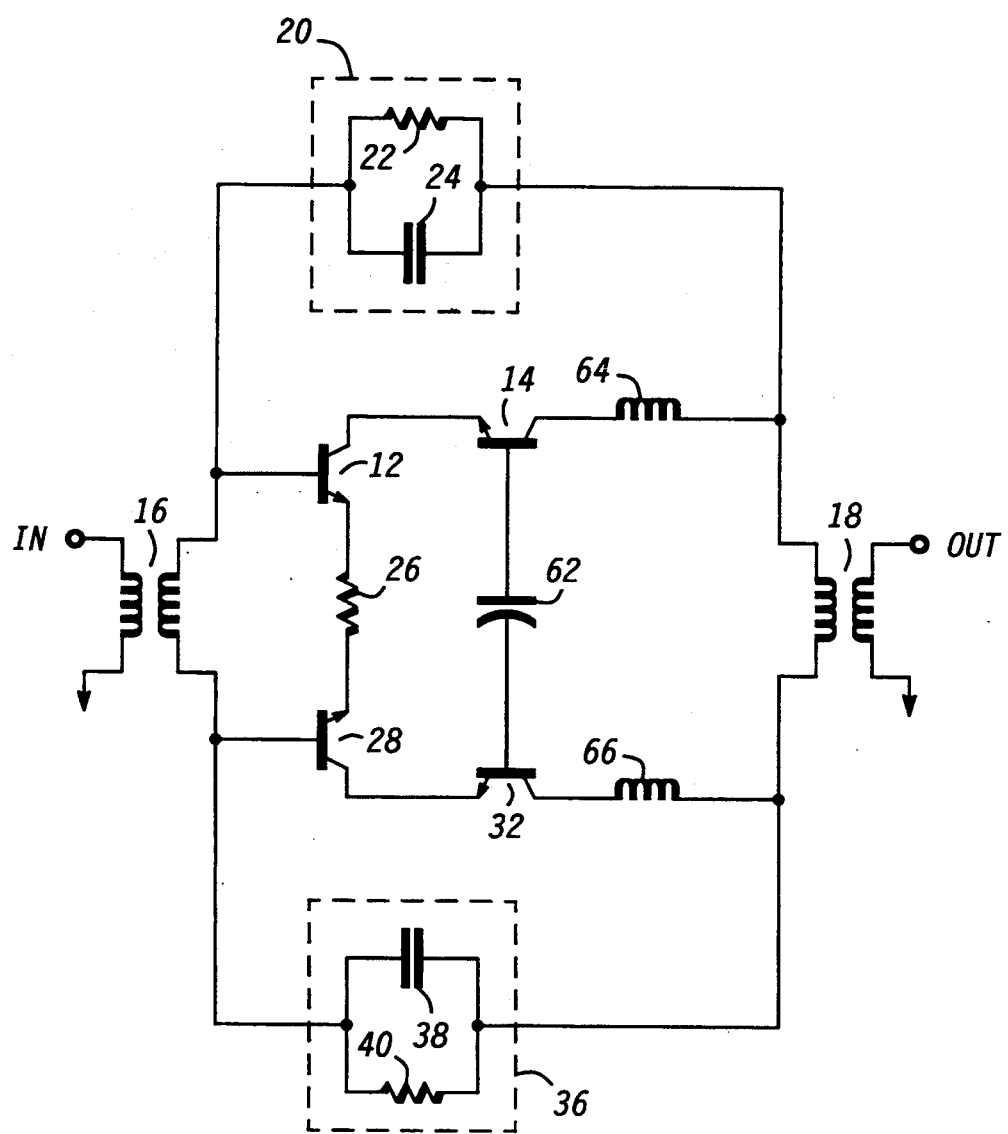
FIG. 4 is a detailed schematic diagram of a push-pull cascode amplifier in accordance with the present invention.

Referring to FIG. 4, there is illustrated a detailed schematic diagram of push-pull cascode amplifier 60. It is understood that components shown in FIG. 4 that are identical to components shown in FIG. 1 are identified by the same reference numbers. Additionally, amplifier 60 includes compensating capacitor 62 coupled between the bases of transistors 14 and 32 wherein the value of capacitor 62 is one half the value of capacitor 52 of FIG. 3. Moreover, amplifier 60 includes compensating inductors 64 and 66 (which are identical in value to the inductor 54 used in the single sided implementation) wherein inductor 64 is coupled between the collector of transistor 14 and output OUT while inductor 66 is coupled between the collector of transistor 32 and output OUT.

The operation of the full balanced amplifier 60 is identical to the single sided implementation as described above. Moreover, the emitter resistor 26 and the base capacitor 62 have different values by a factor of two in the balanced circuit as compared to the single sided implementation of FIG. 3.

By now it should be apparent from the foregoing discussion that a novel circuit for compensating a cascode amplifier has been provided. The circuit includes a capacitor and an inductor for enhancing the stability of the amplifier and for extending the usable frequency range of the amplifier by maintaining the group delay of the amplifier substantially constant over a large frequency range. With such a compensated amplifier, an improved CTB distortion performance in the upper operating frequency range of the amplifier is achieved with increased stability. In other words, the bandwidth of the amplifier is extended with improved stability and distortion performance.

While the invention has been described in specific embodiments thereof, it is evident that many alterations, modifications and variations will be apparent to those skilled in the art. Further, it is intended to embrace all such alterations, modifications and variations in the appended claims.

I claim:

1. A circuit for compensating a cascode amplifier, the cascode amplifier including a common emitter transistor having a base responsive to an input signal and a common base transistor having a collector for providing an output signal at an output of the cascode amplifier wherein an emitter of the common base transistor is coupled to a collector of the common emitter transistor, a first feedback circuit coupled between an emitter of the common emitter transistor and a ground reference, wherein said first feedback circuit operates in the frequency range from DC to at least 1000 megahertz, a second feedback circuit coupled between the output of the cascode amplifier and a base of the common emitter transistor, the circuit for compensating comprising:
- a first compensating circuit coupled between the collector of the common base transistor and the output of the amplifier, wherein said first compensating circuit includes an inductive element; and
- a second compensating circuit coupled between the base of the common base transistor and the ground reference.

2. The circuit according to claim 1 wherein said second compensating circuit includes a capacitive element.

3. The circuit according to claim 1 wherein a value of said first compensating circuit is selected so as to maximize a linear phase response performance of the amplifier.

4. The circuit according to claim 1 wherein said second compensating circuit includes a capacitor whose value is selected so as to increase a broadband stability performance of the amplifier.

5. A circuit for compensating a push-pull cascode amplifier, the push-pull cascode amplifier including a first common emitter transistor having a base responsive to an input signal and a first common base transistor having a collector coupled to an output of the push-pull cascode amplifier wherein an emitter of the first common base transistor is coupled to a collector of the first common emitter transistor, a first feedback circuit coupled between the output of the push pull cascode amplifier and a base of the first common emitter transistor, a second common emitter transistor having a base responsive to the input signal and a second common base transistor having a collector coupled to the output of the push-pull cascode amplifier wherein an emitter of the second common base transistor is coupled to a collector of the second common emitter transistor, a second feedback circuit coupled between the output of the push pull cascode amplifier and a base of the second common emitter transistor, the push-pull cascode amplifier further including a first resistor coupled between the emitters of said first and second common emitter transistors, the circuit for compensating comprising:
- a first compensating circuit coupled between the collector of the first common base transistor and the output of the push-pull cascode amplifier;
- a second compensating circuit coupled between the collector of the second common base transistor and the output of the push-pull cascode amplifier; and
- a third compensating circuit coupled between the bases of the first and second common base transistors.

6. The circuit according to claim 5 wherein said first compensating circuit includes an inductive element.

7. The circuit according to claim 5 wherein said second compensating circuit includes an inductive element.

8. The circuit according to claim 5 wherein said third compensating circuit includes a capacitive element.

9. The circuit according to claim 5 wherein said first and second compensating circuits includes inductors whose value are selected so as to maximize a linear phase response performance of the push-pull cascode amplifier.

10. The circuit according to claim 5 wherein said third compensating circuit includes a capacitor whose value is selected so as to increase a broadband stability performance of the push-pull cascode amplifier.

11. An amplifier having increased stability and enhanced linear phase response, the amplifier comprising:
- a first transistor having a collector, a base and an emitter, said base of said first transistor responsive to an input signal;
- a second transistor having a collector, a base and an emitter, said emitter of said second transistor coupled to said collector of said first transistor;
- a first feedback circuit coupled between said emitter of said first transistor and a first supply voltage terminal, wherein said first feedback circuit operates in the frequency range from DC to a least 1000 megahertz;
- a second feedback circuit coupled between an output of the amplifier and said base of said first transistor;
- an inductive element, which serves as a first compensating circuit, coupled between said collector of said second transistor and said output of the amplifier; and
- a second compensating circuit coupled between said base of said second transistor and said ground reference.

12. The amplifier according to claim 11 wherein said second compensating circuit includes a capacitive element.

13. An amplifier having increased stability and enhanced linear phase response, the amplifier comprising:
- a first transistor having a collector, a base and an emitter, said base of said first transistor responsive to an input signal;
- a second transistor having a collector, a base and an emitter, said emitter of said second transistor coupled to said collector of said first transistor;
- a first feedback circuit coupled between an output of the amplifier and said base of said first transistor;
- a third transistor having a collector, a base and an emitter, said base of said third transistor responsive to said input signal;
- a fourth transistor having a collector, a base and an emitter, said emitter of said fourth transistor coupled to said collector of said third transistor;
- a second feedback circuit coupled between said output of the amplifier and said base of said third transistor;
- a first resistor coupled between said emitters of said first and third transistors;
- a first compensating circuit coupled between said collector of said second transistor and said output of the amplifier;
- a second compensating circuit coupled between said collector of said fourth transistor and said output of the amplifier; and
- a third compensating circuit coupled between said bases of said second and fourth transistors.

14. The amplifier according to claim 13 wherein said first and second compensating circuits include an inductive element.

15. The amplifier according to claim 13 wherein said third compensating circuit includes a capacitive element.

* * * * *